US007188703B2

(12) United States Patent
Hofmann et al.

(10) Patent No.: US 7,188,703 B2
(45) Date of Patent: Mar. 13, 2007

(54) DEVICE FOR ESTABLISHING NOISE IN A MOTOR VEHICLE

(75) Inventors: Marcus Hofmann, Stuttgart (DE); Roudolf Starobinski, Hamburg (DE)

(73) Assignee: DaimlerChrysler AG, Stuttgart (DE)

(*) Notice: Subject to any disclaimer, the term of this patent is extended or adjusted under 35 U.S.C. 154(b) by 242 days.

(21) Appl. No.: 10/998,362

(22) Filed: Nov. 27, 2004

(65) Prior Publication Data

US 2005/0121256 A1 Jun. 9, 2005

Related U.S. Application Data

(63) Continuation-in-part of application No. PCT/EP03/03117, filed on Mar. 26, 2003.

(30) Foreign Application Priority Data

May 29, 2002 (DE) ................................ 102 23 873

(51) Int. Cl.

| | |
|---|---|
| ***F01N 1/16*** | (2006.01) |
| ***G08B 3/02*** | (2006.01) |
| ***G10K 11/22*** | (2006.01) |
| ***B60Q 5/00*** | (2006.01) |
| ***B60Q 9/00*** | (2006.01) |
| *F02M 35/10* | (2006.01) |
| *H05K 5/02* | (2006.01) |

(52) U.S. Cl. ...................... 181/271; 181/144; 181/145; 181/204; 123/184.57; 123/184.21; 340/384.3

(58) Field of Classification Search ................ 181/271, 181/144, 145, 156, 163, 204, 277, 278; 123/184.57, 123/184.21, 184.53; 340/384.1, 438, 439, 340/384.3

See application file for complete search history.

(56) References Cited

U.S. PATENT DOCUMENTS

| | | | | |
|---|---|---|---|---|
| 4,299,121 | A * | 11/1981 | Asayama et al. | 73/118.1 |
| 4,301,332 | A * | 11/1981 | Dusanek | 381/349 |
| 4,577,495 | A * | 3/1986 | Bamer | 73/118.2 |
| 4,618,025 | A * | 10/1986 | Sherman | 181/148 |
| 4,953,655 | A * | 9/1990 | Furukawa | 181/160 |
| 6,551,389 | B2 * | 4/2003 | Spannbauer et al. | 96/380 |
| 6,600,408 | B1 * | 7/2003 | Walter et al. | 340/384.1 |

(Continued)

FOREIGN PATENT DOCUMENTS

DE 44 35 296 4/1996

(Continued)

*Primary Examiner*—Edgardo San Martin
(74) *Attorney, Agent, or Firm*—Klaus J. Bach

(57) ABSTRACT

In a device for establishing noise in a motor vehicle, including a housing having an inlet space, which is in communication via an inlet line with a gas-carrying part of an internal combustion engine arranged in the motor vehicle, and an outlet space, which is acoustically coupled by means of an outlet line to an interior space of the vehicle or the space surrounding the vehicle, the inlet space is separated from the outlet space at least by an acoustically substantially inactive wall. Arranged inside the housing is a sound transmission device, which has vibratable elements, one arranged in the inlet space and onother arranged in the outlet space and connected to each other by a curved connecting element, which is mounted on the acoustically inactive wall, for the transmission of sounds introduced through the inlet line into the inlet space to the outlet space.

17 Claims, 5 Drawing Sheets

U.S. PATENT DOCUMENTS

| | | | | |
|---|---|---|---|---|
| 6,644,436 | B2 * | 11/2003 | Hofmann et al. | 181/214 |
| 6,848,410 | B2 * | 2/2005 | Hoffmann et al. | 123/184.57 |
| 6,932,189 | B2 * | 8/2005 | Helber et al. | 181/240 |
| 2006/0042873 | A1 * | 3/2006 | Alex et al. | 181/250 |
| 2006/0060419 | A1 * | 3/2006 | Alex et al. | 181/250 |

FOREIGN PATENT DOCUMENTS

| | | | | |
|---|---|---|---|---|
| DE | 19704376 | A1 | * | 8/1998 |
| DE | 100 42 012 | | | 5/2001 |
| DE | 10146840.7 | | * | 9/2001 |
| DE | 10016104 | A1 | * | 10/2001 |
| DE | 101 02 923 | | | 5/2002 |
| DE | 10222507.9 | | * | 5/2002 |
| DE | 10114397 | A1 | * | 9/2002 |
| DE | 10212257 | A1 | * | 9/2002 |
| DE | 10223872 | A1 | * | 12/2003 |
| EP | 1306829 | A2 | * | 5/2003 |
| JP | 58091328 | A | * | 5/1983 |
| JP | 02 248610 | | | 10/1990 |

* cited by examiner

DEVICE FOR ESTABLISHING NOISE IN A MOTOR VEHICLE

This is a Continuation-In-Part Application of International Application PCT/EP03/03117 filed Mar. 26, 2003 and claiming the priority of German application 102 23 873.1 filed May 29, 2002.

BACKGROUND OF THE INVENTION

The invention relates to a device for establishing noise in a motor vehicle including an internal combustion engine. The device includes a housing with an inlet space in communication, via an inlet line, with a gas carrying part of the internal combustion engine and an outlet space which is acoustically coupled by an outlet line to the interior of the motor vehicle.

Such a device is known, for example, from DE 44 35 296 A1. With such devices, the noises produced by the internal combustion engine are to be transmitted more intensely to the driver of the motor vehicle, in particular during acceleration, in order to provide, on one hand, for a more intensive driving experience and, on the other hand, to provide more information concerning the load state of the engine.

The disadvantages of this known device, however, are its relatively low efficiency and a certain susceptibility to failure because of the use of a membrane.

DE 100 42 012 A1 attempts to improve the efficiency of the overall device. However, an optimum solution is still not offered there either, in particular concerning the susceptibility of the membrane to failure which may be caused by high gas pressures, for example in connection with supercharged engines.

It is therefore the object of the present invention to provide a device for establishing noise in a motor vehicle which is both well suited for supercharged engines and ensures an adequate possibility of transmitting to the driver the sound produced by the engine.

SUMMARY OF THE INVENTION

In a device for establishing noise in a motor vehicle, including a housing having an inlet space, which is in communication, via an inlet line, with a gas-carrying part of an internal combustion engine arranged in the motor vehicle, and an outlet space, which is acoustically coupled, by means of an outlet line, to an interior space of the vehicle or the space surrounding the vehicle, the inlet space is separated from the outlet space by an acoustically substantially inactive wall. Arranged inside the housing is a sound transmission device, which has vibratable elements, one arranged in the inlet space and another arranged in the outlet space and connected to each other by means of a curved connecting element, which is mounted on the acoustically inactive wall, for the transmission of sounds introduced through the inlet line into the inlet space to the outlet space.

The division of the hollow body into the inlet space and the outlet space by means of the acoustically inactive wall has the effect that the device according to the invention can advantageously also be exposed to the pressure loading occurring in connection with supercharged engines.

The transmission of the sound waves induced by the engine from the inlet space into the outlet space, and consequently from the engine to the interior space of the motor vehicle or to the space surrounding the motor vehicle, is made possible according to the invention by the sound transmission device extending both into the inlet space and into the outlet space, so that the driver is able to acoustically perceive the impression of the sound of the engine, which may depend for example on the engine load.

The two vibratable elements, which are parts of the sound transmission device, are connected to each other according to the invention by a curved connecting element, which is mounted on the acoustically inactive wall and, when the vibratable element arranged in the inlet space is subjected to pressure, performs a pivot or pendular movement about its pivot point, and consequently transmits the vibrations from the one vibratable element to the other vibratable element. The described pivot movement of the connecting element allows the same to be mounted very easily on the acoustically inactive wall, since, advantageously, no axial movement of the connecting element occurs.

The invention will become more readily apparent form the following description of an exemplary embodiments thereof showing the principle on which the present invention is based and describing it on the basis of the accompanying drawings:

DETAILED DESCRIPTION OF THE EMBODIMENTS

Figure 1:
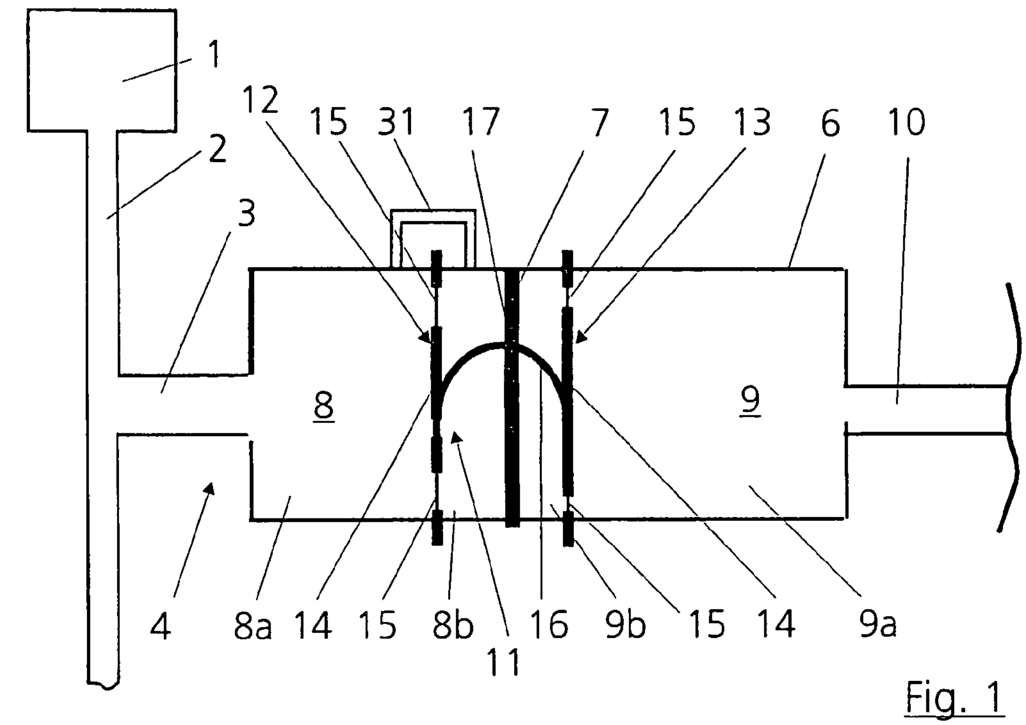
FIG. 1 shows a first embodiment of the device according to the invention with a sound transmission device.

FIG. 1 shows an intake line 2, leading to an internal combustion engine 1, that is, a gas-carrying line which is connected via an inlet line 3 to a device 4 for generating in the interior of a motor vehicle the noises produced by the engine 1. Instead of branching off from the intake line 2, the inlet line 3 may also branch off from some other gas-carrying line of the engine 1, that is for example from an exhaust line. Like the engine 1, the intake line 2 and the inlet line 3, the device 4 is located in a motor vehicle, which is not represented in its entirety. The device is capable of influencing both the noise in an interior space 5 of the motor vehicle and in the surroundings of the motor vehicle.

The device 4 has a housing or hollow body 6, which is subdivided by a wall 7 so as to form an inlet space 8 and an outlet space 9. The wall is acoustically substantially inactive that is to say does transmit the sound from the inlet space 8 to the outlet space 9. The inlet space 8 is connected to the inlet line 3 and the outlet space 9 is connected to an outlet line 10, which, in the present case, leads to the interior space 5 of the motor vehicle. However, the outlet line 10 could lead also to a space surrounding the motor vehicle.

Arranged inside the hollow body or housing 6 is a sound transmission device 11, which has two vibratable elements 12 and 13, of which the first vibratable element 12 is arranged in the inlet space 8 and the second vibratable element 13 is arranged in the outlet space 9. The two vibratable elements 12 and 13 subdivide the inlet space 8 and the outlet space 9 in each case into two subspaces **8*a* and 8*b* and 9*a* and 9*b*, respectively, which are closed off from one another. It would however be possible to connect to the subspaces 8*b* and 9*b*, which are respectively located between one of the vibratable elements 12 and 13 and the acoustically inactive wall 7, additional inlet or outlet lines, which are not represented in the present case. In this case, the same static pressure respectively prevails in front of, and behind, the two vibratable elements 12 and 13**, so that there is no static pressure loading.

In the embodiment represented, each of the vibratable elements 12 and 13 respectively has rigid plate portions 14 and, attached to the plate portions 14, compliant membrane portions 15, which are connected to the hollow body 6. In this way, the two vibratable elements 12 and 13 can be vibrated, and consequently of the sound transmission device 11 is able to transmit sound. Alternatively, it would also be possible for only one of the vibratable elements 12 and 13 to have the rigid plate portions 14.

The two vibratable elements 12 and 13 are joined by means of a curved, substantially U-shaped connecting element 16, which extends through the acoustically inactive wall 7 and is mounted on the same by means of a sealing and bearing element 17. The sealing and bearing element 17, on the one hand, supports the connecting element 16 as described in more detail below and on the other hand, completely seals the acoustically inactive wall 7, which is provided with an opening in this region. The connecting element 16 can be attached to the two vibratable elements 12 and 13 in any way desired.

The connecting element 16 is in the present case a resilient component, which may be for example round or rectangular in cross section. It has a rigidity which influences the transmission characteristics of the sound transmission device 11. The U-shaped curved form of the connecting element 16 and its mounting by means of an elastic sealing and bearing element 17 consisting for example rubber on the acoustically inactive wall 7 transmits the sound vibrations of the first vibratable element 12, arranged in the inlet space 8, by a pivot movement of the connecting element 16 about the sealing and bearing element 17, to the second vibratable element 13, which is arranged in the outlet space 9. As a result, the sound waves are transmitted from the inlet space 8 to the outlet space 9, and consequently ultimately from the engine 1 to the interior space 5 of the vehicle in spite of the gastight separation described above of the inlet space 8 from the outlet space 9 by means of the acoustically inactive wall 7. In order to facilitate the desired pivoting of the sound transmission device 11, the sealing and bearing element 17 may for example be much less compliant with respect to forces acting in the axial direction than with respect to the forces acting in the direction of the pivot movement. This also simplifies the mounting of the connecting element 16 in the axial direction.

A connecting line 31 runs from the inlet space 8 to the subspace **8*b*, in order to provide pressure equalization. Instead of the connecting line 31, it would also be possible not to provide a passage through the plate portions 14, or through the wall of the hollow body 6**, in order to permit pressure balancing. In the case of the exemplary embodiments which follow, these two possibilities could likewise be provided, but they are not described in each case.

Figure 2:
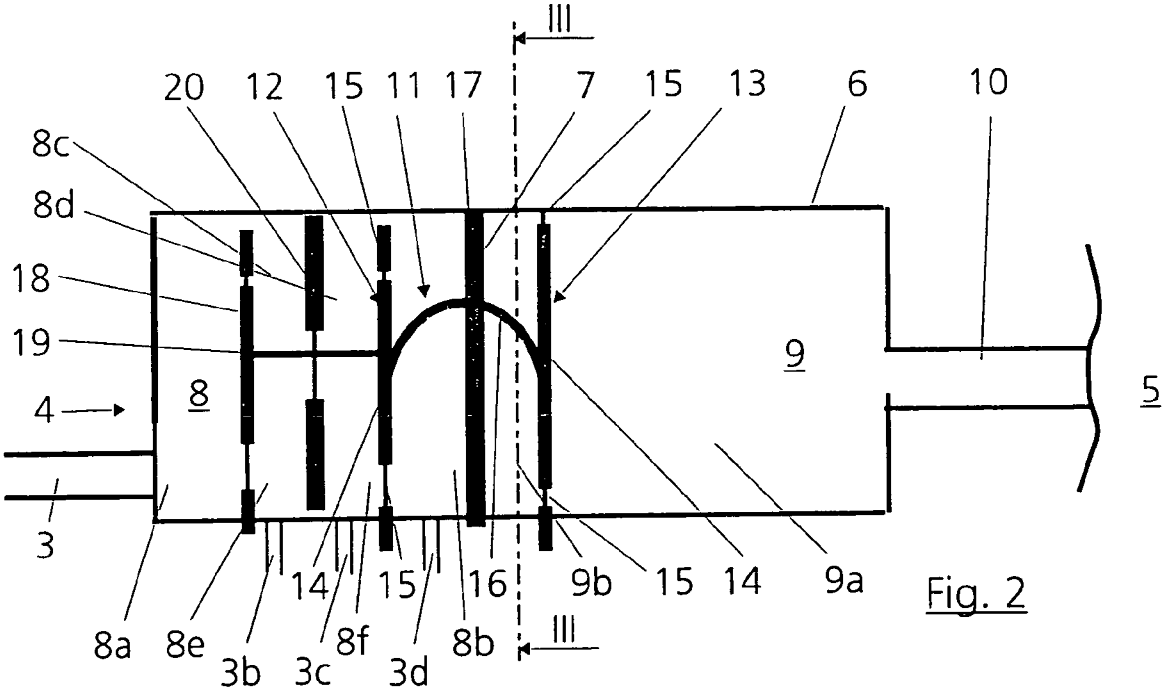
FIG. 2 shows a second embodiment of the device according to the invention different from that shown in FIG. 1.

FIG. 2 shows a further exemplary embodiment of the device 4, in which the sound transmission device 11 is configured in an almost identical way to that according to FIG. 1. However, in the inlet space 8 there is arranged an additional vibratable element 18, which is connected to the first vibratable element 12 by means of a further connecting element 19, which in this case is formed as a straight rod. With the additional vibratable element 18 the noise, which is passed on to the second vibratable element 13 arranged in the outlet space 9, can be influenced.

Also provided in the inlet space 8 is a further acoustically inactive wall 20, through which the connecting element 19 extends, so that the inlet space 8 is subdivided into altogether six subspaces **8*a*, 8*b*, 8*c*, 8*d*, 8*e* and 8*f*. In this case, it would be possible to introduce into each or at least some of the subspaces 8*a*, 8*b*, 8*c*, 8*d*, 8*e* and 8*f* a separate inlet line, for example each connected to a different intake pipe of an intake manifold (not represented) of the engine 1. In this case, further inlet lines 3*b*, 3*c* and 3*d* provide for communication with the subspaces 8*b*, 8*e* and 8*f*, and the same applies to them as to the aforementioned inlet line 3**.

Figure 3:
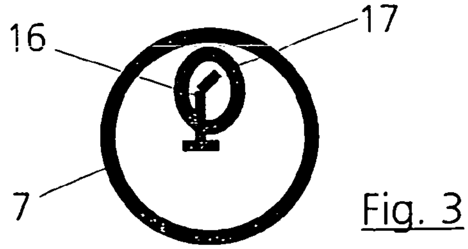
FIG. 3 is a sectional view along the line III—III of FIG. 2.

FIG. 3 shows a section through the, in the present case cylindrical, hollow body 6, wherein it is shown how the connecting element 16 is supported in sealing and bearing element 17.

Figure 4:
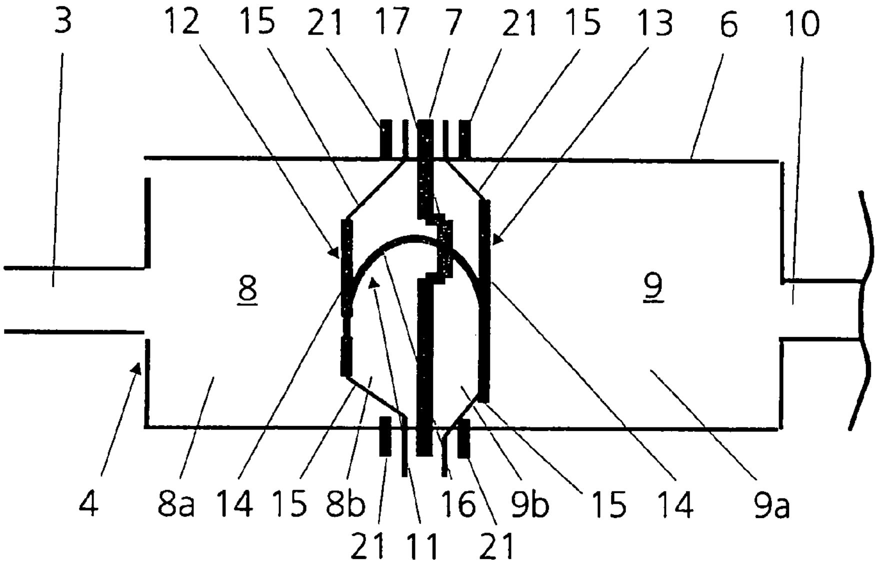
FIG. 4 shows a third embodiment of the device according to the invention.

A further embodiment of the device 4, in which the membrane portions 15 of the two vibratable elements 12 and 13 are attached to the hollow body 6 together with the acoustically inactive wall 7 by means of fastening elements 21, is represented in FIG. 4. It is, of course, also possible to provide only one fastening element 21, formed for example in an annular manner. This embodiment simplifies the mounting of the sound transmission device 11 on the hollow body 6.

Figure 5:
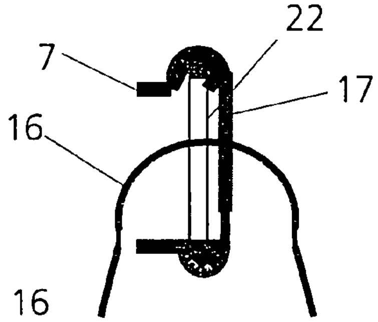
FIG. 5 shows an enlarged representation of FIG. 4.

Furthermore, in this case the sealing and bearing element 17 is fastened to the acoustically inactive wall 7 by means of a spring device 22 and is pre-stressed by means of the spring device 22. This is shown more clearly in FIG. 5. The configuration simplifies the mounting of the sealing and bearing element 17 and provides for flexibility in the transmission characteristics of the overall sound transmission device 11 because of the variable design of the spring device 22 and the influencing of the way in which the sealing and bearing element 17 can move. This is achieved by the different vibrational characteristics of the two vibratable elements 12 and 13. It can be achieved in practice with a harder, relatively rigid, support for the sealing and bearing element 17. The more rigid support provides for different transmission characteristics, permitting the transmission of different frequencies. In the case of the other exemplary embodiments, the sealing and bearing element 17 may for example be adhesively bonded to the acoustically inactive wall 7.

Figure 6:
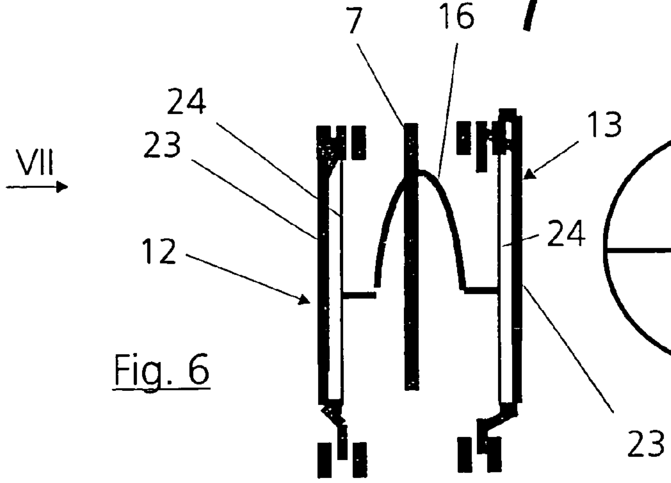
FIG. 6 shows a further embodiment of the sound transmission device according to the invention.
Figure 7:
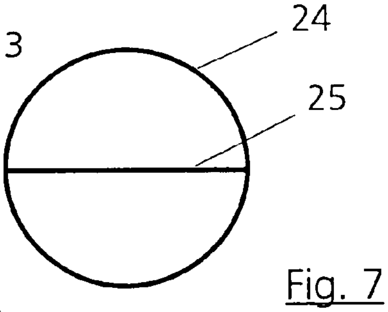
FIG. 7 shows a view in the direction of the arrow VII of FIG. 6.
Figure 8:
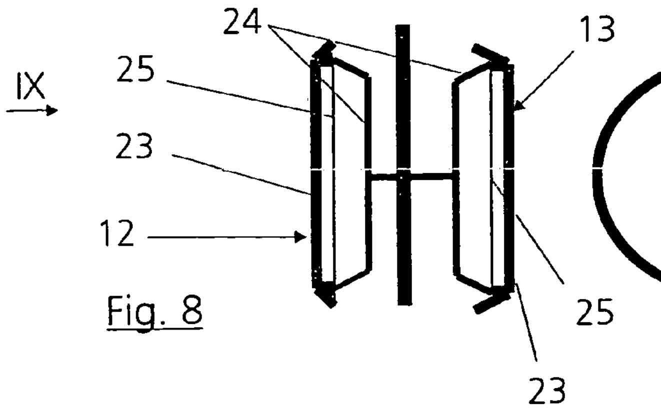
FIG. 8 is a view turned by 90° of the device shown in FIG. 6.
Figure 9:
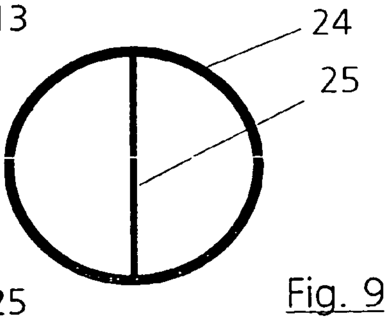
FIG. 9 is a view taken along the arrow IX of FIG. 8.

FIG. 6 and FIG. 7 and also FIG. 8 and FIG. 9 show alternative embodiments of the vibratable elements 12 and 13. Each of the vibratable elements 12 and 13 has here a membrane 23 and a spring ring 24, which reinforces the membrane 23. The membrane 23 is mounted on the spring ring 24, which is formed here in an annular manner with a central cross-piece 25 extending through it. The spring ring 24 may provide for a certain flexibility in the transmission characteristics of the sound transmission device 11. The connecting element 16 may be attached for example to the central cross-piece 25. It also applies to these exemplary embodiments of the vibratable elements 12 and 13 to which the vibrations are transferred by means of the pivot movement of the connecting element 16, whereby the sound waves are transmitted from the inlet space 8 to the outlet space 9.

Figure 10:
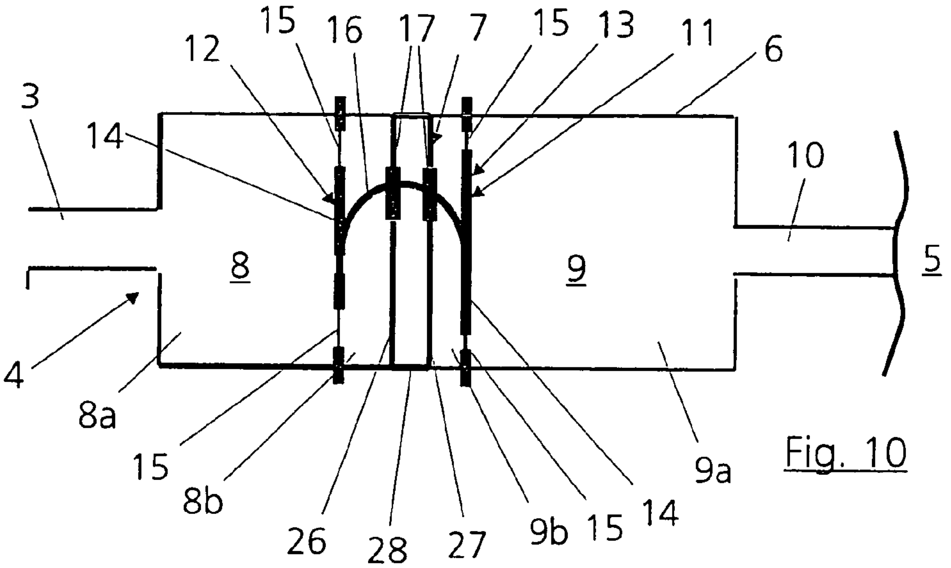
FIG. 10 shows a further embodiment of the device according to the invention.

In the embodiment of the device 4 according to FIG. 10, the acoustically inactive wall 7 has two wall portions 26 and 27, which, in the present case, extend substantially parallel to each other and are connected to each other at their periphery, that is in the region of the hollow body 6, by a resilient connecting element 28. By changing the rigidity of the resilient connecting element 28, it is possible to influence the sound produced by the sound transmission device 11. This may also be done when the device 4 is already installed in the motor vehicle, that is for example also during driving. In the case of this embodiment, each of the wall portions 26 and 27 has a sealing and bearing element 17, so that the connecting element 16 is mounted on altogether two sealing and bearing elements 17 with respect to the acoustically inactive wall.

Figure 11:
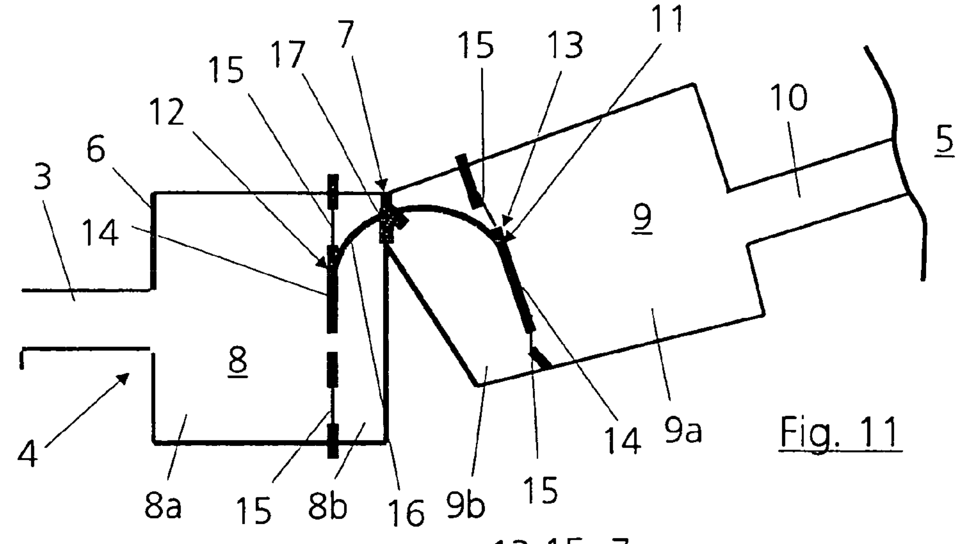
FIG. 11 shows still another embodiment of the device according to the invention.

In order to illustrate that the inlet space 8 may also be spatially separated from the outlet space 9, a corresponding exemplary embodiment is represented in FIG. 11. Here, too, however, the first vibratable element 12 is arranged in the inlet space 8 and the second vibratable element 13 is arranged in the outlet space 9, the two vibratable elements 12 and 13 being connected to each other in turn by means of the connecting element 16 extending through the acoustically inactive wall 7. However, here the acoustically inactive wall 7 is not the direct separating member between the inlet space 8 and the outlet space 9, but forms part of the outer wall of the hollow body 6. This makes it possible, if appropriate, for the inlet space 8 to be provided separately from the outlet space 9 in the motor vehicle and for them to be connected to each other only by the connecting element 16 extending through the sealing and bearing element 17, which of course depends on the space available in the respective motor vehicle.

Figure 12:
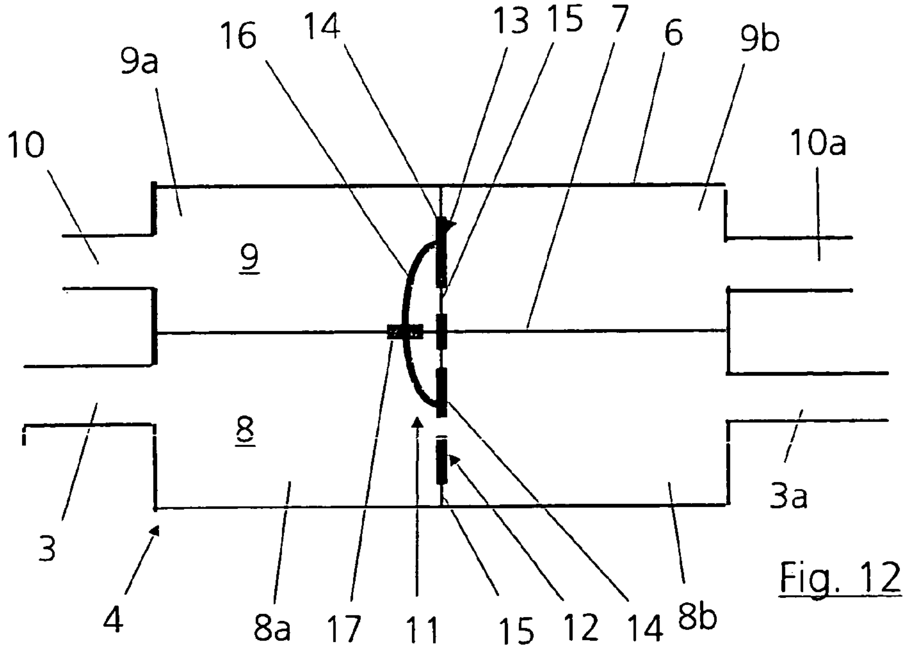
FIG. 12 shows a further embodiment of the device according to the invention.

FIG. 12 shows a device 4 which is substantially identical to the embodiment according to FIG. 1 with respect to the principle by which it operates. Here, however, the two vibratable elements 12 and 13 extend perpendicularly in relation to the acoustically inactive wall 7 that divides the hollow body 6 in the horizontal direction. The two vibratable elements 12 and 13 are connected to each other in the region of the acoustically inactive wall, and the connecting element 16, which is mounted on the acoustically inactive wall 7 by means of the sealing and bearing element 17 and which connects the two vibratable elements 12 and 13 to each other, is also still provided. With this arrangement relatively small axial forces are required, but the connecting element 16 is still supported by the sealing and bearing element 17. Here, the subspaces 8*a* and 8*b* and also 9*a* and 9*b* are respectively provided each with an additional inlet line 3*a* and an additional outlet line 10*a*.

Figure 13:
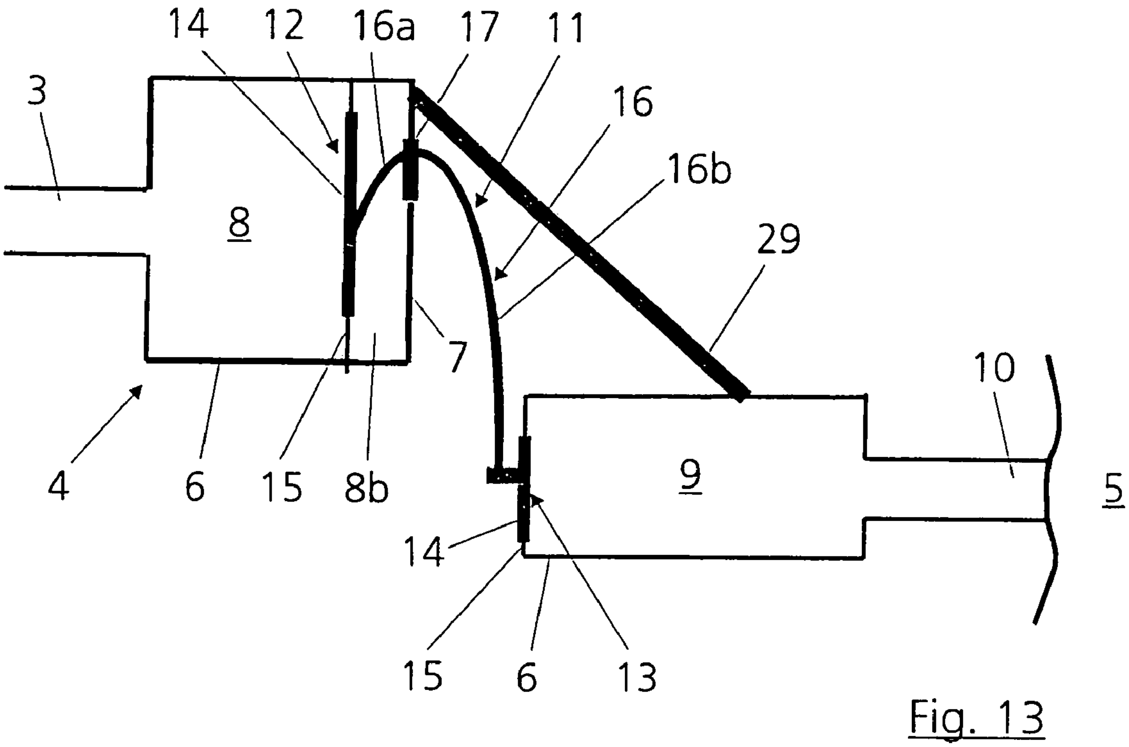
FIG. 13 shows a still further embodiment of the device according to the invention.

FIG. 13 shows a further embodiment of the device 4, in which the connecting element 16 is again supported by the sealing and bearing element 17. However, in contrast to the previous exemplary embodiments, the connecting element 16 is not symmetrically configured but has, extending from the sealing and bearing element 17, a shorter portion 16*a* and a longer portion 16*b*. This permits mechanical intensification or reduction of the forces and deflections described above.

Furthermore, it is evident that, in a continuation of the exemplary embodiment according to FIG. 11, the inlet space 8 and the outlet space 9 are not part of a common hollow space, but are only connected to each other by means of the connecting element 16. A further connecting element 29 provides a rigid coupling of the inlet space 8 to the outlet space 9. In a way not represented, it would also be conceivable to provide the engine 1 as a coupling between the two spaces 8 and 9.

Figure 14:
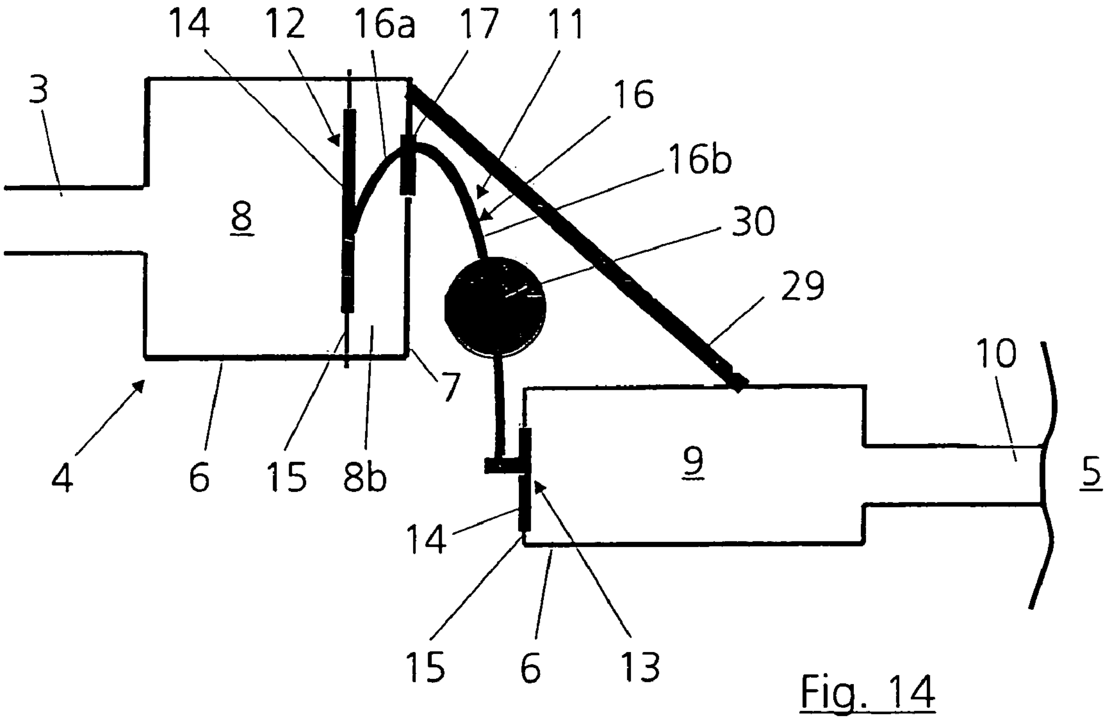
FIG. 14 shows a further embodiment of the device according to the invention.

A further possible way of influencing or intensifying different frequencies is provided by the embodiment according to FIG. 14. Here, the connecting element 16 is provided with an additional mass 30, which changes the vibrational transmission properties of the connecting element 16. Otherwise, the device 4 according to FIG. 14 corresponds to that according to FIG. 13.

Figure 15:
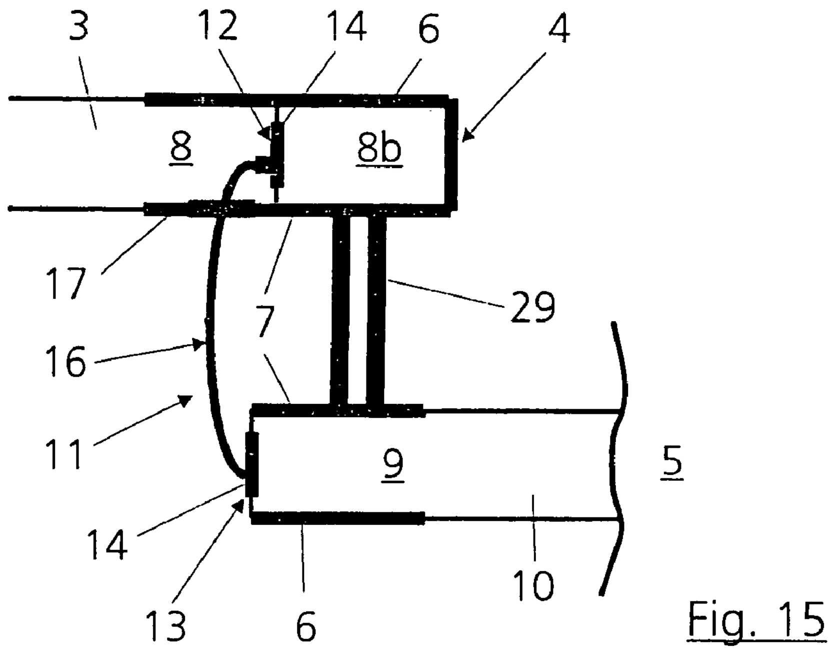
FIG. 15 shows a further embodiment of the device according to the invention.

In FIG. 15, the inlet space 8 is likewise separate from the outlet space 9, the connection being established by means of the connecting element 29. Consequently, the embodiment of the device 4 according to FIG. 15 represents a combination of the embodiments according to FIG. 12 and FIG. 13.

Figure 16:
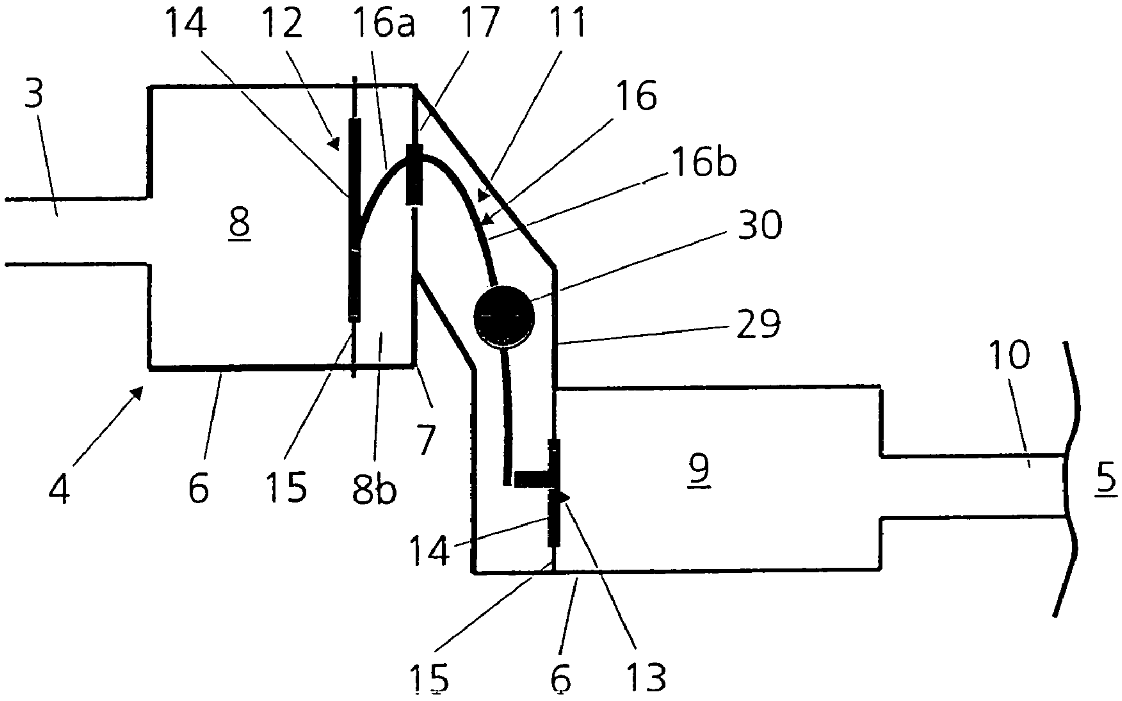
FIG. 16 shows a further embodiment of the device according to the invention.

FIG. 16 shows an embodiment which is very similar to the embodiment of the device 4 according to FIG. 14. Here, the connecting element 19 is configured in the form of an additional volume around the transmission element 16. This provides on the one hand for additional influencing of the sound and on the other hand for protection of the connecting element 16 against soiling from the outside.

All the embodiments of the device 4 that are represented in FIGS. 1 to 16 may be combined with one another in any way desired if they are not mutually exclusive.

The invention claimed is:

1. A device for establishing noise in a motor vehicle having an internal combustion engine (1) with a gas carrying part (2), said device comprising a housing (6), which has an inlet space (8), an inlet line (3) connected to said inlet space (8) and to said gas-carrying part (2) of said internal combustion engine (1), an outlet space (9), which is acoustically coupled by means of an outlet line (10) to at least one of an interior space of the motor vehicle and the space surrounding the vehicle, an acoustically substantially inactive wall (7) separating said inlet space (8) from the outlet space (9), and a sound transmission device (11) including, at least two vibratable elements (12, 13), one of which (12) is arranged in the inlet space (8) and the other (13) of which is arranged in the outlet space (9), said at least two vibratable elements (12, 13) being connected to each other by means of a curved connecting element (16), which is mounted on the acoustically inactive wall (7), in such a way that, when the vibratable element (12) arranged in the inlet space (8) is subjected to the sound introduced through the inlet line (3), the connecting element (16) performs a pivot movement, transmitting the vibrations of the vibratable element (12) arranged in the inlet space (8) to the vibratable element (13) arranged in the outlet space (9).

2. The device as claimed in claim 1, wherein the connecting element (16) is mounted on the acoustically inactive wall (7) by means of a sealing and bearing element (17).

3. The device as claimed in claim 2, wherein the sealing and bearing element (17) consists of an elastic material.

4. The device as claimed in claim 2, wherein the sealing and bearing element (17) is fastened to the acoustically inactive wall (7) by means of a spring device (22) and is pre-stressed by means of the spring device (22).

5. The device as claimed in claim 1, wherein the connecting element (16) is substantially U-shaped.

6. The device as claimed in claim 1, wherein the connecting element (16) is a resilient component.

7. The device as claimed in claim 6, wherein a mass (30) is attached to the connecting element (16).

8. The device as claimed in claim 1, wherein at least one of the at least two vibratable elements (12, 13) has rigid plate portions (14) and, attached to the plate portions (14), compliant membrane portions (15).

9. The device as claimed in claim 8, wherein the compliant membrane portions (15) are connected at least indirectly to the housing (6).

10. The device as claimed in claim 9, wherein the compliant membrane portions (15) are attached to the housing (6) together with the acoustically inactive wall (7).

11. The device as claimed in claim 1, wherein the at least two vibratable elements (12, 13) have each a membrane (23) and a spring ring (24), reinforcing the membrane (23).

12. The device as claimed in claim 1, wherein the vibratable elements (12, 13) respectively extend across the inlet space (8) and the outlet space (9) so as to subdivide the inlet and outlet spaces (8, 9) into at least two subspaces (8*a*, 8*b* and 9*a*, 9*b*, respectively).

13. The device as claimed in claim 12, wherein one of the subspaces (8*a*; 8*b*) formed in the inlet space (8) is connected to an additional inlet line (3*a*).

14. The device as claimed in claim 12, wherein one of the subspaces (9*a*; 9*b*) formed in the outlet space (9) is connected to an additional outlet line (10*a*).

15. The device as claimed in claim 1, wherein at least one additional vibratable element (18) is arranged in the inlet space (8).

16. The device as claimed in claim 1, wherein the acoustically inactive wall (7) has at least two wall portions (26, 27), which are connected to each other at their periphery by a resilient connecting element (28).

17. The device as claimed in claim 1, wherein the connecting element (16) has two portions (16*a*, 16*b*) of different lengths.

* * * * *